United States Patent
Dorney et al.

(10) Patent No.: US 7,293,216 B2
(45) Date of Patent: *Nov. 6, 2007

(54) BIT ERROR POSITION ESTIMATION IN DATA DECODER

(75) Inventors: Robert L. Dorney, Solana Beach, CA (US); Joseph C. Chan, San Diego, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 382 days.

This patent is subject to a terminal disclaimer.

(21) Appl. No.: 10/913,076

(22) Filed: Aug. 6, 2004

(65) Prior Publication Data

US 2005/0010840 A1 Jan. 13, 2005

Related U.S. Application Data

(63) Continuation of application No. 09/905,154, filed on Jul. 12, 2001, now Pat. No. 6,789,225.

(51) Int. Cl.
*G11C 29/00* (2006.01)
*H03M 13/00* (2006.01)

(52) U.S. Cl. ...................... 714/752; 714/786

(58) Field of Classification Search ............... 714/786, 714/752
See application file for complete search history.

(56) References Cited

U.S. PATENT DOCUMENTS 6,012,158 A * 1/2000 Kurita et al. ............... 714/752
6,366,624 B1 4/2002 Balachandran et al.

\* cited by examiner

*Primary Examiner*—Shelly Chase
(74) *Attorney, Agent, or Firm*—Blakely, Sokoloff, Taylor & Zafman LLP

(57) ABSTRACT

A bit error position is estimated. The estimation method includes generating data indicative of a substantial number of bit error locations in data frames. The generation of the data includes re-encoding decoded bit stream, mapping the bit stream to a first set of symbols, and determining a soft decision distance between a second set of symbols received through a data transmission channel and the first set of symbols. The generated data is then used to estimate the bit error locations. The estimation process includes capturing metric data for each bit in the data frame and obtaining derivative of the metric data. The derivative may be filtered for further processing. Error position estimation criteria may then be applied to estimate the bit error positions.

19 Claims, 5 Drawing Sheets

BIT ERROR POSITION ESTIMATION IN DATA DECODER

"This is a continuation of Ser. No. 09/905,154, filed Jul. 12, 2001, entitled 'BIT ERROR POSITION ESTIMATION IN DATA DECODER', now U.S. Pat. No. 6,789,225 B2."

BACKGROUND

The present invention relates to bit errors, and more particularly, to estimating bit error positions in a data decoder.

Error correcting techniques for correcting bit errors in digital data are often used to improve the reliability of data transmission. These techniques attempt to accurately retrieve the data with lowest bit error rate (BER). For example, a scheme of coding data by using convolutional codes and performing maximum likelihood decoding by using Viterbi decoding has a high error correcting capability. However, certain data such as compressed video data may be especially sensitive to bit errors. Thus, data frames containing bit errors may be identified using techniques such as cyclic redundancy check. In some applications or protocols, such as Transmission Control Protocol (TCP), these data frames containing bit errors may be retransmitted. However in other applications or protocols, such as real-time streaming video or User Datagram Protocol (UDP), re-transmission of error frames may not be practical or supported.

Further, when a frame of data such as video data known to contain errors is decoded for display, data recovery and/or error concealment techniques may be employed to mitigate visual distortions or artifacts caused by the errors. However if the position of bit errors within the frame cannot be estimated, substantially all or most of the error frame data, including both corrupted and uncorrupted data, may have to be discarded. Therefore, data recovery and/or error concealment techniques may be made substantially less practical when even the uncorrupted data is discarded.

SUMMARY

In one aspect, a method for estimating a bit error position is disclosed. The estimation method includes generating data indicative of a substantial number of bit error locations in data frames. The data generation includes re-encoding decoded bit stream, mapping the bit stream to a first set of symbols, and determining a soft decision distance between a second set of symbols received through a data transmission channel and the first set of symbols. The generated data is then used to estimate the bit error locations. The estimation process includes capturing metric data for each bit in the data frame and obtaining derivative of the metric data. The derivative may be filtered for further processing. Error position estimation criteria may then be applied to estimate the bit error positions.

In another aspect, a bit error position estimation system is disclosed. The system includes a de-interleaver, a convolutional decoder, a convolutional re-encoder, a map symbol generator, and a position estimation metric generator. In some systems, the de-interleaver and the convolutional decoder are part of the existing receiver in a data transmission system. The de-interleaver receives and de-interleaves a first set of encoded data symbols. The convolutional decoder performs maximum likelihood decoding of the data symbols into data bit stream. The convolutional re-encoder re-codes decoded data bit stream. The map symbol generator maps the re-coded bit stream to a second set of data symbols. The position estimation metric generator then determines metric data between the first and second sets of data symbols.

DETAILED DESCRIPTION

In recognition of the above-stated difficulties with prior data recovery and/or error concealment techniques, the present invention describes embodiments for incorporating the bit error position estimation into these techniques. Thus, effectiveness of some data recovery and/or error concealment techniques may improve substantially if approximate locations of errors within the frame of data are known. Consequently for purposes of illustration and not for purposes of limitation, the exemplary embodiments of the invention are described in a manner consistent with such use, though clearly the invention is not so limited.

Figure 1:
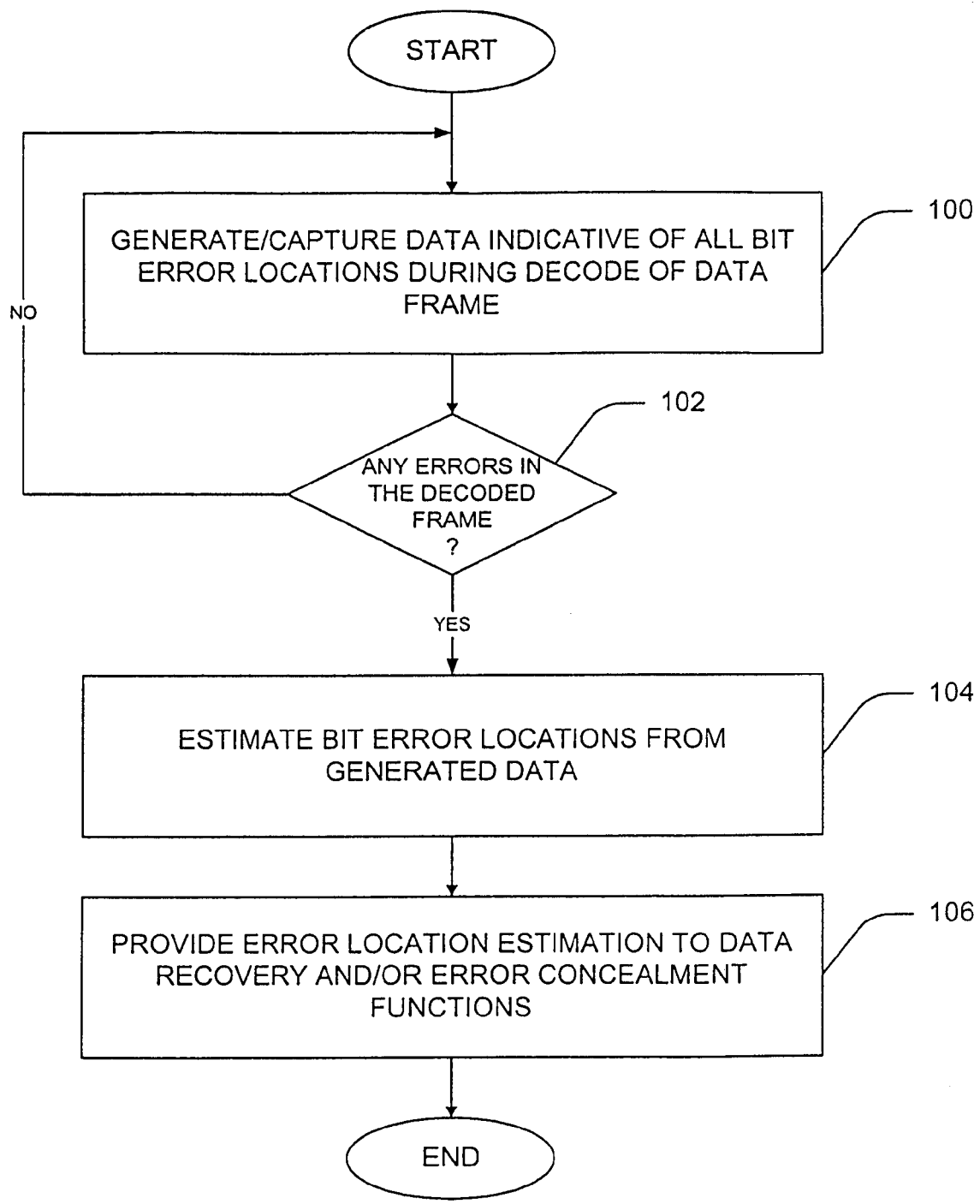
FIG. 1 is a flowchart describing a method for estimating the approximate position of bit errors in accordance with an embodiment of the present invention.

FIG. 1 is a flowchart describing a method for estimating the approximate position of bit errors in accordance with an embodiment of the present invention. The data indicative of a substantial number of bit error locations may be captured or generated at 100. In the illustrated embodiment, the data is generated during decoding of data frames. In other embodiments, the data may be generated at different stages of processing received data. At 102, a determination is made as to whether the generated data includes any errors.

As stated above, the presence of errors in the data frame may be determined using cyclic redundancy check. The cyclic redundancy checksum (CRC), included in transmitted frame data, indicates whether a frame includes bit errors. Other frame error indications may also be available. When the frame CRC indicates that bit errors exist within the current frame, bit error locations may be estimated from the generated data at 104. The bit error location estimation may then be provided to the data recovery and/or error concealment functions, at 106. The bit error position estimations may be formatted appropriately for use in data recovery, error concealment, error correction, and/or other similar applications. Otherwise if no errors exist, the error position estimation data is discarded and the process continues to the next frame, at 100.

A process for generation of data indicative of bit error locations (see 100 in FIG. 1) may be implemented in several different embodiments. In one embodiment, the bit error position data generation process 100 may be implemented by creating a bit-wise metric from soft decision. In another embodiment, the bit error position data generation process may be implemented by extracting bit-wise maximum likelihood (MLH) metric. In this embodiment, the MLH metric may be generated stage-by-stage during Viterbi decoding of the convolutionally encoded bit stream. The metrics in both embodiments provide a bit-wise likelihood of incorrect reception of data bits. These bit-wise confidence measures may be used generally for estimating the location of bit errors in data frames.

Since maximum likelihood detection is already calculated in the Viterbi decoder, the generation of MLH metric may require little additional processing. Moreover, it is determined that MLH metric provides a more sensitive measure than the soft decision metric. Thus, MLH metric may produce fewer false error indications than the metric derived from soft decisions. However, the MLH metric may not be externally available in some decoder hardware implementations. Therefore, symbol soft decisions may be more readily available for use in error position estimation schemes.

Figure 2:
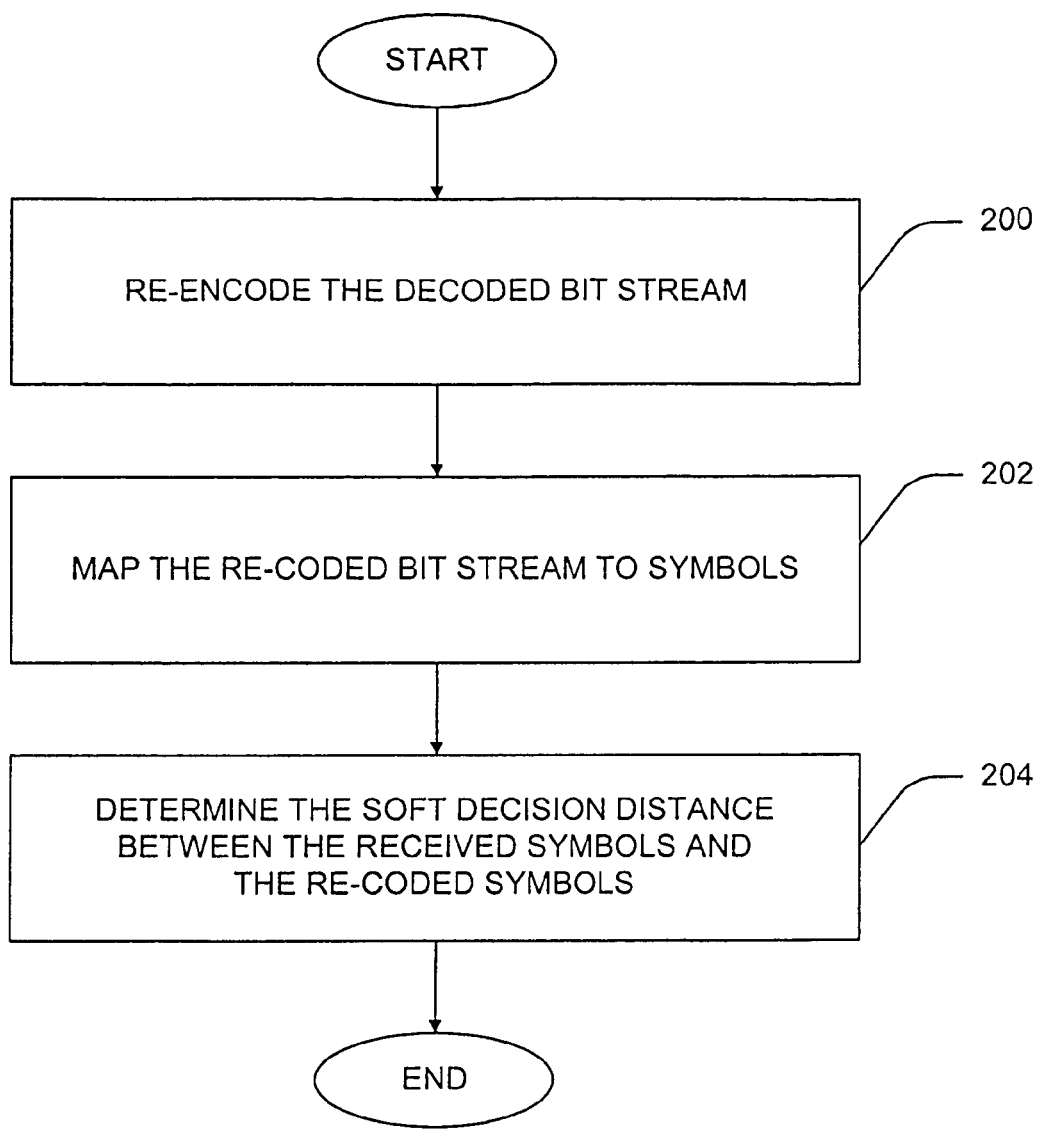
FIG. 2 shows a bit error position data generation process according to one embodiment.

The bit error position data generation process 100 according to one embodiment of the present invention is illustrated in FIG. 2. In the illustrated embodiment, the decoded bit stream is re-encoded at 200. The decoded bit stream may be a Viterbi decoder output. At 202, the re-coded bit stream is mapped to symbols. The soft decision distance between the received symbols and the re-coded symbols is then determined at 204. The soft decision distance may be calculated for each bit position using the following approach for data convolutionally encoded at rate N:

$$(SD_{decoder} - SD_{re-coder})_{sym\_1}^2 + (SD_{decoder} - SD_{re-coder})_{sym\_2}^2 + \cdots + (SD_{decoder} - SD_{re-coder})_{sym\_N}^2.$$

Figure 3:
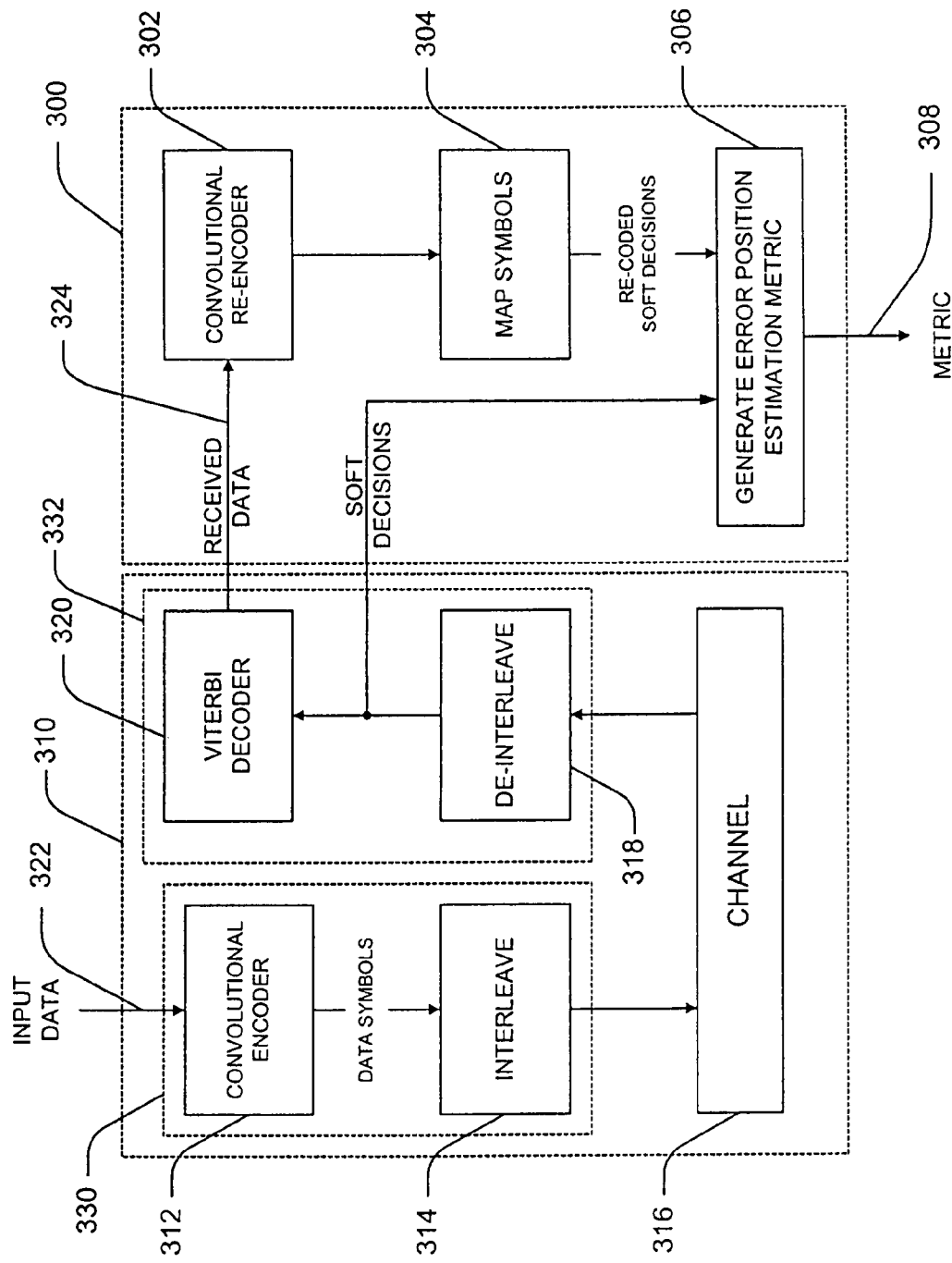
FIG. 3 is a block diagram of a bit error position estimation system according to an embodiment of the present invention.

FIG. 3 shows a block diagram of a bit error position estimation system 300 according to an embodiment of the present invention. The system 300 includes a convolutional re-encoder 302, a map symbol generator 304, and a position estimation metric generator 306. Thus, the system 300 is configured to implement the process described in FIG. 2.

The bit error position estimation system 300 is further coupled to a data transmission system 310, which includes a transmitter 330, a receiver 332, and a data channel 316. The transmitter 330 includes a convolutional encoder 312 and an interleaver 314. The convolutional encoder 312 encodes input data bits 322 into data symbols at a fixed or variable encoding rate with an encoding technique which facilitates subsequent maximum likelihood decoding of the data symbols into data bits in a convolutional decoder, such as a Viterbi decoder 320. The data symbols may then be input to the interleaver 314. The interleaver 314 interleaves the input data symbols at the symbol level.

The encoded data is then transmitted through the data channel 316 to the receiver 332, which includes a de-interleaver 318 and a convolutional decoder 320. The de-interleaver 318 in the receiver 332 de-interleaves the encoded data symbols and sends the data symbols to the convolutional decoder 320. A convolutional decoder such as the Viterbi decoder 320 may then perform maximum likelihood decoding of the data symbols into data bits.

The bit error position estimation system 300 generates bit-wise error position estimation metric 308. The convolutional re-encoder 302 receives decoded data 324 from the Viterbi decoder 320 to re-encode the decoded bit stream. The map symbol generator 304 then maps the re-coded bit stream to symbols. The position estimation metric generator 306 determines the soft decision distance between the received symbols from the de-interleaver 318 and the re-coded symbols from the map symbol generator 304.

Figure 4:
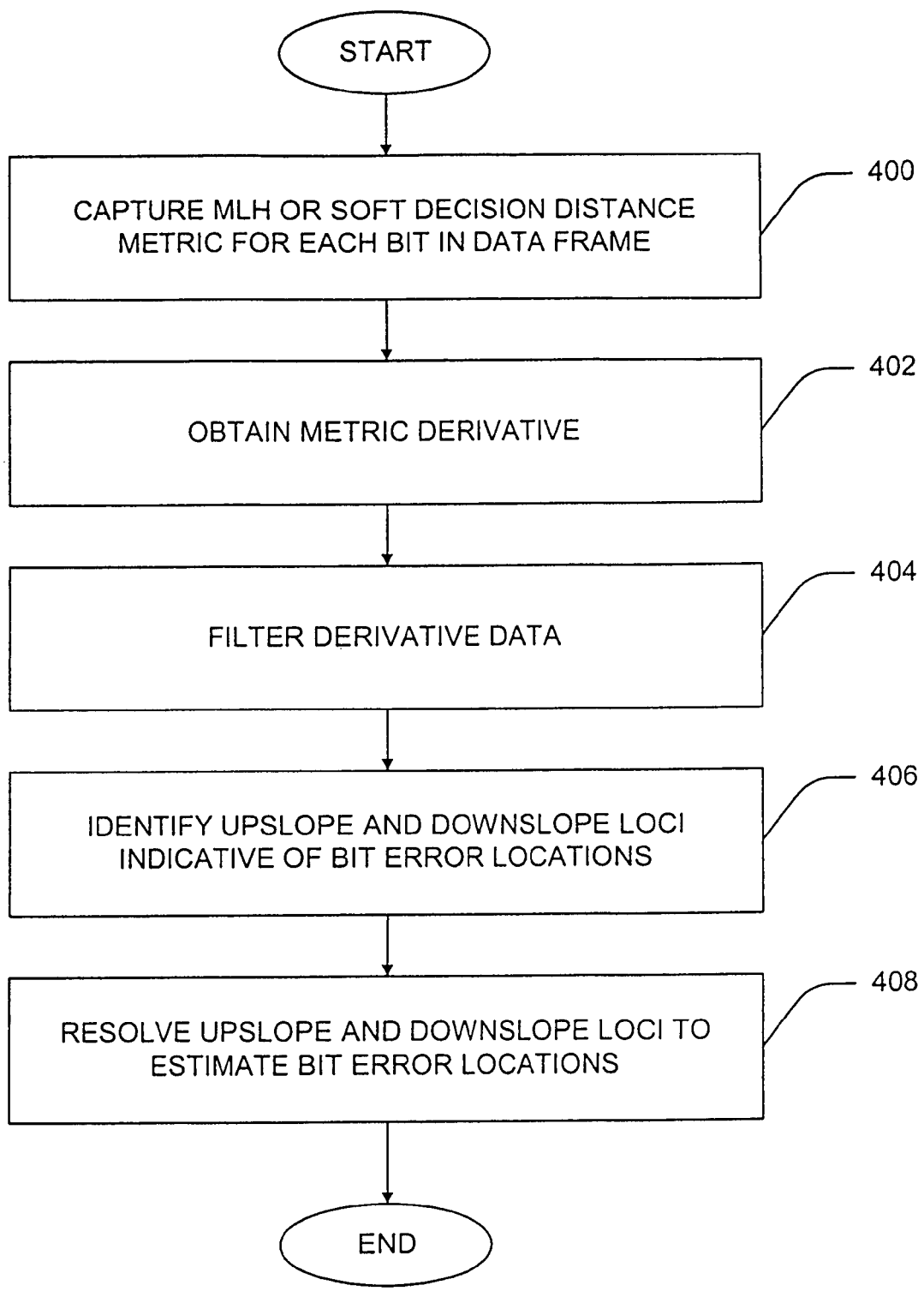
FIG. 4 illustrates a process for estimating the bit error locations from the generated data in accordance with an embodiment.

FIG. 4 illustrates a process for estimating the bit error locations from the generated data (see 104 in FIG. 1) in accordance with an embodiment of the present invention. The process includes capturing MLH or soft decision distance metric for each bit in a data frame, at 400. An error position estimation metric generator 306 may perform the metric capture. In the illustrated embodiment, derivative of the metric data is then obtained at 402. In one embodiment, the derivative may be obtained as a sequence of signed difference magnitudes between sequential data points.

The metric data (MLH or soft decision distance) may be manipulated into a data sequence waveform suitable for the application of error position estimation criteria. Thus at 404, a filter, such as moving average or low-pass, may be applied to the derivative of the metric data. Filtering provides a sequence of data points appropriate for bit error position estimation. The resulting data sequence waveform (shown in FIG. 5) typically exhibits characteristic patterns, such as valleys for MLH or peaks for soft decision distance, indicative of bit error locations.

Bit error positions may then be estimated, plus/minus a positional tolerance, by applying criteria such as slope/inclination magnitude or peak/valley detection to points on the filtered waveform. In the illustrated embodiment of FIG. 4, the application of criteria includes identifying the locus of points where both leading and trailing slopes exceed pre-set thresholds (at 406), and resolving or averaging the leading/trailing slope loci to produce an estimation of error position (at 408).

Error detection thresholds may be made adjustable and selected to effectively increase performance of some criteria, such as minimization of undetected errors. The threshold may also be determined adaptively, and detection confidence factors applied. The use of adjustable thresholds allows tradeoffs between bit error estimation statistics such as valid detects, false detects, and missed detects. However, error detection thresholds selected to minimize missed-detects may also cause a corresponding increase in false-detects.

Figure 5:
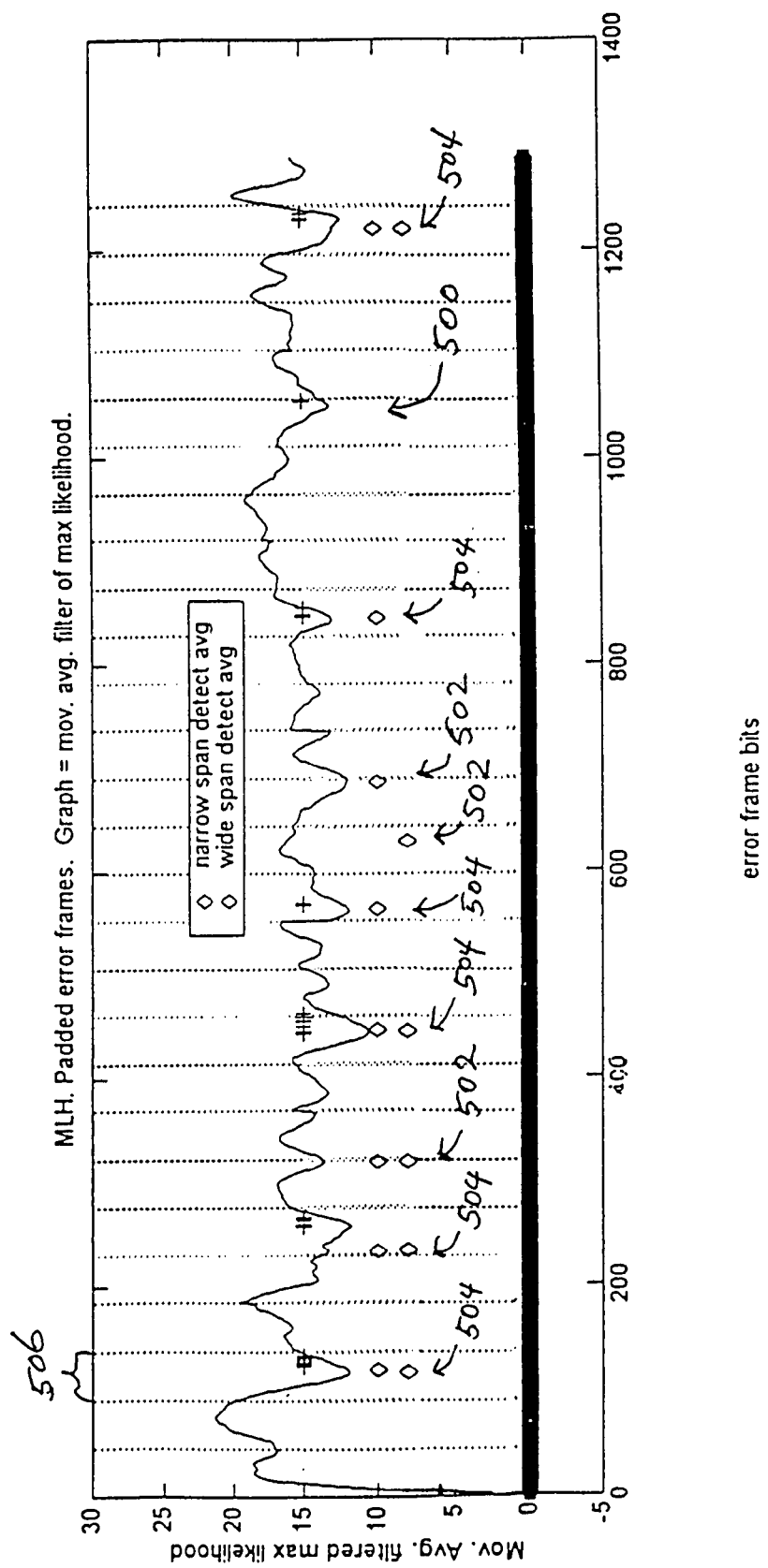
FIG. 5 shows a data sequence waveform exhibiting characteristic patterns indicative of bit error locations.

FIG. 5 shows a data sequence waveform exhibiting characteristic patterns, such as valleys for MLH, indicative of bit error locations. The waveform is obtained as a result of filtering applied to the derivative of the metric data. The figure indicates a detected bit error with a diamond marker (◇). The actual bit error is indicated with a cross hair (+) indicator. The actual error is obtained by comparing the input data 322 with the decoded data 324.

In the illustrated example of FIG. 5, there are one missed-detect 500, three false-detects 502, and six valid-detects of bit errors 504. In the figure, the extent of each vertical dotted line 506 represents a quadrant of a data frame. Accordingly, this particular example resolves the bit error position to within about a quadrant of a data frame. However, the bit error position may be estimated to a finer resolution than a frame quadrant but at correspondingly increased computation time and power.

There has been disclosed herein embodiments for incorporating the bit error position estimation into data recovery and/or error concealment techniques. Estimation of the bit error position provides relatively quick determination of areas where error concealment processing is needed. Thus, although this technique may be applicable to several different applications, the technique may be especially effective in improving the quality of recovered data in real-time applications.

While specific embodiments of the invention have been illustrated and described, such descriptions have been for purposes of illustration only and not by way of limitation. Accordingly, throughout this detailed description, for the purposes of explanation, numerous specific details were set forth in order to provide a thorough understanding of the present invention. It will be apparent, however, to one skilled in the art that the system and method may be practiced without some of these specific details. For example, specific criteria/method for bit error position estimation from the generated waveform, described in FIG. 4 (see 406, 408), is for illustrative purposes only. Other comparable method such as manual detection may be employed to detect the bit error. In other instances, well-known structures and functions were not described in elaborate detail in order to avoid obscuring the subject matter of the present invention. Accordingly, the scope and spirit of the invention should be judged in terms of the claims which follow.

What is claimed is:

1. A bit error position estimation system, comprising:
   an encoder adapted to encode a data bit stream;
   a map symbol generator adapted to map the encoded data bit stream to a first set of data symbols; and
   a position estimation metric generator adapted to determine metric data associated with the first set of data symbols and a second set of data symbols.

2. The bit error position estimation system of claim 1, wherein the metric data is a soft decision distance between the first set of data symbols and the second set of data symbols.

3. The bit error position estimation system of claim 1, wherein the position estimation metric generator is in communication with a receiver to receive the second set of data symbols.

4. The bit error position estimation system of claim 3, wherein the encoder is a convolutional re-encoder to encode the data bit stream by re-coding the data bit stream previously decoded by the receiver.

5. The bit error position estimation system of claim 3, wherein the encoder further receives the data bit stream from the receiver.

6. The bit error position estimation system of claim 1, wherein the receiver comprises:
   a data channel;
   a de-interleaver arranged to receive and de-interleave the second set of encoded data symbols from the data channel; and
   a convolutional decoder to perform maximum likelihood decoding of the second set of data symbols into the data bit stream.

7. The bit error position estimation system of claim 6, wherein the receiver further comprises:
   a convolutional encoder to encode input data bits into data symbols; and
   an interleaver arranged to interleave data symbols, said interleaver operating to transmit said data symbols through the data channel.

8. Software stored in a memory and executed logic embodied within a bit error position estimation system, comprising:
   a first software application configured to encode a data bit stream;
   a second software application configured to map the encoded data bit stream to a first set of data symbols; and
   a third software application configured to determine metric data associated with the first set of data symbols and a second set of data symbols, the metric data including a soft decision distance between the first and second set of data symbols.

9. The software of claim 8, wherein the second set of data symbols is received as an output from a receiver separate from the bit error position estimation system.

10. The software of claim 9, wherein the receiver comprises a de-interleaver to provide the second set of data symbols to the third software application.

11. The software of claim 9, wherein the first software application to encode the data bit stream by recoding a bit stream resulting from an encoded bit stream decoded by the receiver.

12. The software of claim 11, wherein the receiver comprises a Viterbi decoder to provide the data bit stream to the first application software.

13. The software of claim 8, wherein the third software application determining the metric data by conducting a sum of bit-wise computations of soft decision distances between each data symbol from the first set of data symbols and its corresponding data symbol from the second set of data symbols.

14. A system, comprising:
   a re-encoder to re-code a decoded bit stream;
   a map symbol generator to map the re-coded bit stream into a first set of data symbols; and
   a position estimation metric generator to determine bit error location estimates between the first set of data symbols and a second set of data symbols.

15. The system of claim 14, wherein the bit error location estimates are computed based on determining a soft decision distance between the first set of data symbols and the second set of data symbols.

16. The system of claim 14, wherein the position estimation metric generator is in communication with a receiver to receive the second set of data symbols.

17. The system of claim 14, wherein the re-encoder further receives the decoded bit stream from the receiver.

18. The system of claim 17, being in communication with the receiver comprising:
   a data channel;
   a de-interleaver arranged to receive and de-interleave the second set of encoded data symbols from the data channel; and
   a convolutional decoder to decode the second set of data symbols into the decoded bit stream.

19. The system of claim 18, being in communication with the receiver further comprising:
   a convolutional encoder to encode input data bits into data symbols; and
   an interleaver arranged to interleave data symbols, said interleaver operating to transmit said data symbols through the data channel.

* * * * *